United States Patent
Benzel et al.

(10) Patent No.: US 6,972,447 B2
(45) Date of Patent: Dec. 6, 2005

(54) SEMICONDUCTOR COMPONENT HAVING A FIRST EARLIER STRUCTURE DIFFERING FROM A SECOND EARLIER STRUCTURE

(75) Inventors: Hubert Benzel, Pliezhausen (DE); Hans Artmann, Magstadt (DE); Frank Schaeffer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/655,839

(22) Filed: Sep. 4, 2003

(65) Prior Publication Data

US 2004/0048430 A1 Mar. 11, 2004

(30) Foreign Application Priority Data

Sep. 5, 2002 (DE) ................................ 102 41 066

(51) Int. Cl.⁷ ............................................. H01L 29/84
(52) U.S. Cl. ...................... 257/254; 257/417; 257/414; 438/52; 438/53; 73/704; 73/715; 73/716; 73/718
(58) Field of Search .... 257/254, 415–420; 438/50–53, 438/48; 73/718–715, 704, 724

(56) References Cited

U.S. PATENT DOCUMENTS

| | | | |
|---|---|---|---|
| 6,641,643 B2 * | 11/2003 | Jensvold et al. | 95/45 |
| 2002/0157473 A1 * | 10/2002 | Stemme et al. | 73/704 |
| 2002/0170875 A1 * | 11/2002 | Benzel et al. | 216/2 |

FOREIGN PATENT DOCUMENTS

| | | |
|---|---|---|
| DE | 100 32 579 | 1/2002 |
| DE | 100 46 622 | 4/2002 |
| EP | 1 088 785 | 4/2001 |
| WO | WO 02/36484 | 5/2002 |
| WO | WO 03/016203 | 2/2003 |

OTHER PUBLICATIONS

R.W Tjeskstra et al. "Multi-walled Microchannels: Free-standing Porous Silicon Membrane For Use in Mu TAS", Journal of Microelectromechanical Systems, IEEE INC., Bd. 9 Nr. 4, Dec. 2000, pp. 495-501.

H. Artmann et al., "Monocrystalline SI Membranes For Pressure Sensors Fabricated By A Novel Surface Micromachining Process Using Porous Silicon", Proceedings of Spie, Merrnes Components and Applications for Industry, Automobiles, Aerospace and Communication II, Jam. 28-29, 2003, San Jose, CA, Bd. 4981, pp. 65-70.

G. Lammel et al. "Free-Standing, Mobile 3D Porous Silicon Microstructures", Sensors and Actuators A., Bd. 85, No. 1-3, Aug. 25, 2000, pp. 356-360.

* cited by examiner

Primary Examiner—Dung A. Le
(74) Attorney, Agent, or Firm—Kenyon & Kenyon

(57) ABSTRACT

A semiconductor component for a semiconductor substrate, in which a first section and a second section are provided, and in which the pore structure of the first section differs from the pore structure of the second section.

6 Claims, 3 Drawing Sheets

SEMICONDUCTOR COMPONENT HAVING A FIRST EARLIER STRUCTURE DIFFERING FROM A SECOND EARLIER STRUCTURE

FIELD OF THE INVENTION

The present invention is directed to a semiconductor component and to a related method.

BACKGROUND INFORMATION

German Patent Published Application No. 100 32 579 refers to a method for fabricating a semiconductor component and a semiconductor component, where a hollow space or a cavity is produced in or on a semiconductor substrate, which is then used for sensing pressure. In this connection, in accordance with the related art, one layer of the semiconductor component is provided of porous silicon. In this context, a pressure sensor is produced using surface micromechanics by rearranging porous silicon. The rearrangement results in a cavity or a hollow space being formed underneath a diaphragm of silicon.

SUMMARY OF THE INVENTION

The semiconductor component according to the present invention and the method according to the present invention, are intended to prevent the surface, and thus the hollow space or cavity, from closing prematurely. The process of rearranging the porous silicon to form the cavity or the hollow space is subdivided into a plurality of process steps. For that reason, after the porous silicon structure is produced, the native silicon oxide formed as the result of open-air storage, must be dissolved (reduced) at temperatures of between 900 and 1100° C. in an $H_2$ atmosphere, in a first rearranging process step. In a second rearranging process step, the surface of the porous silicon is subsequently closed at 900° C. to 1200° C. in $H_2$ atmosphere. In a third rearranging process step, a diaphragm is formed by epitaxially growing silicon, during the growth process, the porous silicon also being partially rearranged and thus contributing to the cavity formation.

It may be necessary to dissolve the silicon oxide in the first process step, since, otherwise, the subsequent rearranging process cannot or can only be poorly be carried out. The silicon oxide is dissolved by the reducing $H_2$ atmosphere in the first process step. At the same time, the surface closes during this annealing step, so that premature closing of the surface may occur, causing residual oxide to still remain in the porous silicon layer. In this situation, a complete rearrangement in the porous silicon layer and, thus, the cavity formation is prevented or made more difficult. The semiconductor component according to the present invention or the method according to the present invention diminish this premature closing of the porous silicon layer and thereby ensure that the cavity is reliably and completely formed.

The arrangement according to the present invention for inducing this effect of preventing a premature closing of the cavity provides for introducing so-called venting holes into the porous silicon layer. This prevents a premature closing of the surface and thereby ensures a complete oxide solution, along with a subsequent rearrangement. These venting holes are produced in accordance with the present invention by selectively subjecting certain diaphragm regions to an undercutting-type etching, thereby producing a different pore structure in these diaphragm regions than in the remaining diaphragm region. In accordance with the present invention, this other pore structure closes distinctly later than the pore structure of the remaining diaphragm region.

It may be especially beneficial that the earlier pore structure in the first section be oriented substantially perpendicularly to the main substrate plane and that the earlier pore structure in the second section be oriented substantially in parallel to the main substrate plane. These lateral pores which run horizontally, i.e., in parallel to the main substrate plane, when the main substrate plane of the substrate is disposed horizontally, close up substantially later than pores which are provided perpendicularly to the surface, i.e., perpendicularly to the main substrate plane.

The diaphragm surface regions which have lateral pores may thus be used as the venting holes according to the present invention for exchanging gas in the last stages of the solution of the silicon oxide. In addition, it may be advantageous that the earlier pore structure in the second section is provided as a mesoporous structure or that the earlier pore structure in the second section is provided as a nanoporous structure, or that the pore structure in the second section has a higher porosity than in the first section. In this way, there are various ways to simply form the venting holes according to the present invention. In the area of the venting holes, the crystal structure of the epitaxial layer is afflicted with several imperfections. This is especially characteristic of the higher porosity, or of the nano-or mesoporous pore structure, or of the characteristic running direction of the pores in parallel to the surface.

It may also be advantageous if the semiconductor substrate is made of silicon material. In this manner, by selectively introducing pores, the cavity or hollow space may be produced in accordance with the present invention in a simple, controlled fashion. It may also be advantageous that an epitaxial layer is provided above the porous layer. In this way, different types of piezo-sensitive measuring elements may be accommodated in the epitaxial layer and, thus, for example, to use the semiconductor component according to the present invention as a pressure sensor.

DETAILED DESCRIPTION

Figure 1:
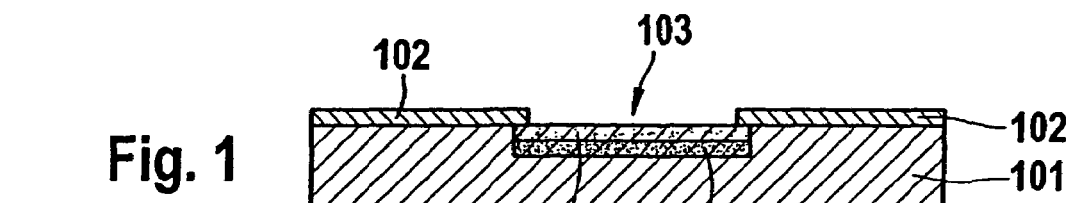
FIG. 1 shows a first stage of an available pressure sensor according to the related art.

FIG. 1 shows a preliminary stage of a conventional pressure sensor. On the top side of a silicon substrate 101, a mask layer 102 is produced, a region 103 not covered by mask layer 102 being formed. The mask layer may, for example, be a nitride layer, an n-doped layer (for a p-doped silicon substrate), or some other suitable layer that, to a large extent, will not be attacked by the etching medium subsequently used. The top side of silicon substrate 101 is electrochemically etched by using a suitable etching medium in such a way that the etching medium generates small openings or pores in silicon substrate 101 directly underneath uncovered region 103. A silicon layer 104 having low porosity is formed. Through these small openings or pores of silicon layer 104, the etching medium reaches deeper regions of silicon substrate 101 and likewise forms pores in the silicon in these regions. In the process, a porous silicon layer 105 is formed underneath porous silicon layer 104. The etching medium used for electrochemical etching, particularly wet etching, may be hydrofluoric acid (HF) or an etching medium containing, inter alia, hydrofluoric acid (HF). An electrical field may be generated between the top and the bottom sides of silicon substrate 101, the rate of expansion of the pores, i.e., openings or hollow spaces, being influenced by adjusting the applied electrical field strength or electrical current density. In one electrochemical etching method of the present invention, the preliminary pressure-sensor stages to be etched are placed in a trough-shaped vessel which is filled with the etching medium, and an electrical voltage is applied to opposite ends of the etching medium in such a way that the electrical field is generated. To ensure that the top, porous silicon layer 104 is formed in the region directly underneath region 103 not covered by mask layer 102, in a first step, a not necessarily constant electrical current density is set on uncovered region 103, following application of the etching medium. It may be selected so as to form openings or pores in silicon substrate 101, directly underneath uncovered region 103. Another important criterion for the not necessarily constant electrical current density set in the first step, is to adjust such an electrical current density that suitable openings or pores are formed in silicon substrate 101 directly underneath uncovered region 103. Suited, in particular, are those openings or pores which subsequently enable a substantially monocrystalline silicon layer to be deposited on porous silicon layer 104 formed during the etching process, thereby forming the actual sensor diaphragm. For that reason, it is necessary that the openings or pores have an adequate size, i.e., diameter. Openings or pores may have, for example, a diameter of approximately 10–100 nm, more specifically, of approximately 10–30 nm. Of course, this is merely an example of suitable openings or pores. Once the etching medium penetrates porous silicon layer 104, in the further course, the current density may be increased in relation to the current density used in forming the more superficial, porous silicon layer 104, thereby enlarging the pores and/or increasing the expansion rate of the hollow spaces, and resulting in the formation of larger pores in deeper silicon layer 105 in comparison to the pores in the more superficial [shallower] porous silicon layer 104. The silicon disintegrated by the etching medium is removed during the etching process and/or subsequently via the openings or pores in porous silicon layer 104, and "fresh" etching medium is introduced.

Figure 2:
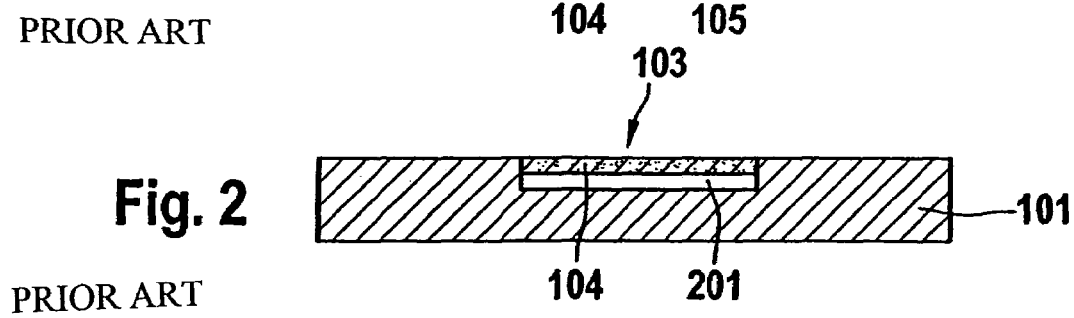
FIG. 2 shows another preliminary stage of the known pressure sensor.

In the method for producing a preliminary stage of a semiconductor component of the present invention, as depicted in FIG. 1, the etching process for producing subsequent hollow space 201, shown in FIG. 2, is adjusted by selecting suitable process parameters and/or one or more suitable etching media in such a way that the porosity of silicon layer 105, which forms subsequent hollow space 201, is adequate. By "adequate" is indicated a porosity greater than 60% and less than 100%. Annealing is subsequently undertaken in the context of the pressure sensor or semiconductor component under the state of the art. The annealing process may be performed under a hydrogen, nitrogen, or noble gas atmosphere and/or at a temperature of above approximately 900° C. Due to the high porosity of silicon layer 105 (compare FIG. 1), the pores of the deeper, porous silicon layer 105 are rearranged in response to the annealing in such a way that a single large pore, thus the hollow space or cavity 201 shown in FIG. 2, is formed underneath the slightly porous silicon layer 104. The pores on the top side of slightly porous silicon layer 104 are substantially sealed during the annealing, i.e., the high-temperature step, so that this too, the actual sensor diaphragm, denoted by reference numeral 301 in FIG. 3, may be deposited as a substantially monocrystalline silicon layer. The conventional semiconductor component having a sealed cavity 201 is illustrated in FIG. 3.

Figure 3:
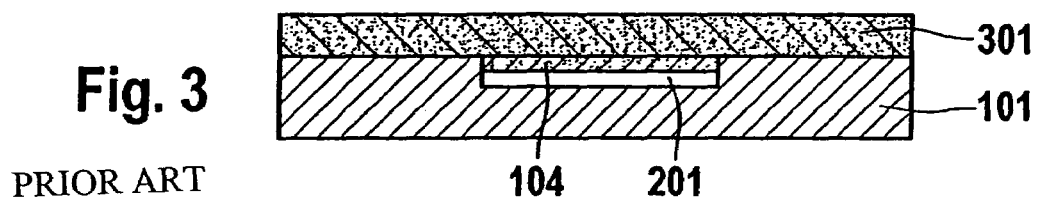
FIG. 3 shows an available pressure sensor according to the related art.

In producing the sealed cavity, the problem arises in the process step of closing the top porous layer, denoted by reference numeral 104 in FIGS. 1 through 3, that, once the porous layers are formed, in response to open-air storage, silicon oxide (native oxide) forms and is not fully removed before the cavity or hollow space 201 is completely closed. It is the aim of the present invention to overcome this problem.

FIG. 4 illustrates various manufacturing stages of the semiconductor component of the present invention. A substrate 101, which is the basis of the semiconductor component of the present invention, is again shown in FIG. 4a. A comparatively strongly positively doped layer (dopant concentration $>5 \cdot 10^{16}$ 1/cm$^3$) is formed on substrate 101 and is denoted by reference numeral 120 in FIG. 4a. Underneath this layer 120, the cavity of the semiconductor component of the present invention forms, and, in the area of this layer 120, the cavity's cover forms, which is also referred to in the following as covering layer. Also provided is a substrate region denoted by reference numeral 130, which is negatively doped and in which no pores are able to be later produced by the etching method for producing porous silicon. The substrate region denoted by 130 is later used as a rim or frame to surround the diaphragm region where the cavity and its covering layer are located. In the diaphragm region, the present invention provides a cover 110, which, in the same way as layer 102 described in connection with FIG. 1, prevents the subjacent region from becoming porous, in accordance with related art methods. At this point, substrate 101, prepared in this manner, is etched. The result is shown in FIG. 4b. As in the method described in the context of the conventional semiconductor component, the etching likewise includes a first stage in which, on the one hand, a covering layer is formed which has a comparatively low porosity and in which, on the other hand, a second layer having a higher porosity is formed underneath the covering layer, i.e., in a deeper location. In a subsequent method step, a reordering of the semiconductor material is effected, a cavity forming in the more porous region, in that silicon particles are rearranged there and are partially also intercalated into the region of the covering layer. As a result of this rearrangement, the cavity is formed which is denoted by 129 in FIGS. 4c and 4d and, superjacent thereto, a covering layer, which originates from the slightly porous substrate layer. The pore structure of the covering layer is typically less defined following the rearranging process than it is following the porosification, but prior to the rearranging process. However, the previous pore structure is also discernible following the rearranging process. The slightly porous substrate layer denoted by 120 in FIG. 4a is divided during the etching process, due to the absence of a cover 110, into a first section of the covering layer and, due to the presence of cover 110, into a second section of the covering layer. First section 122 is not covered by cover 110 during the etching process, and second section 121 is covered by cover 110 during the etching process. Together, particularly following the rearranging process, the two sections form covering layer 150, which is shown in FIG. 4d without any differentiation of its first and second sections. During the etching process, the pores run substantially laterally, i.e., in parallel to the surface or in parallel to the main substrate plane of substrate 101, through cover 110, above section 121 of covering layer 150. In first section 122 of covering layer 150, the pores run substantially perpendicularly to the main substrate plane of substrate 101. Situated beneath covering layer 150 is the layer having a higher proportion of porosity (between 60% porosity and 100% porosity) prior to the rearranging process, or the cavity, subsequent to the rearranging process. This layer is denoted in FIG. 4b by reference numeral 128 (prior to the rearranging process) and in FIG. 4c by reference numeral 129, which is supposed to represent the result of the process of rearranging the silicon material to form cavity 129. The rearranged sections 121 and 122 of the superficially arranged, porous layer are shown in FIG. 4d, in combination, as covering layer 150 or coating layer 150. Above covering layer 150, actual diaphragm layer 140 is shown. In accordance with the present invention, it is made, in particular, of epitaxially grown, monocrystalline silicon. In accordance with the present invention, one or more measuring elements, such as strain-gage resistors or piezoresistive resistors, are introduced to diaphragm layer 140 to detect the deformation of diaphragm layer 140. Thus, diaphragm layer 140 forms the actual sensor diaphragm.

Figure 4A:
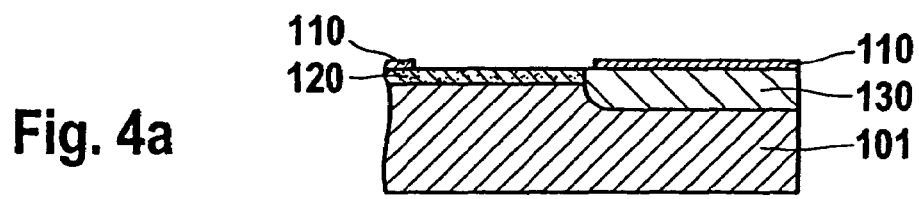
FIG. 4 shows various process stages of the semiconductor component according to the present invention.
Figure 4B:
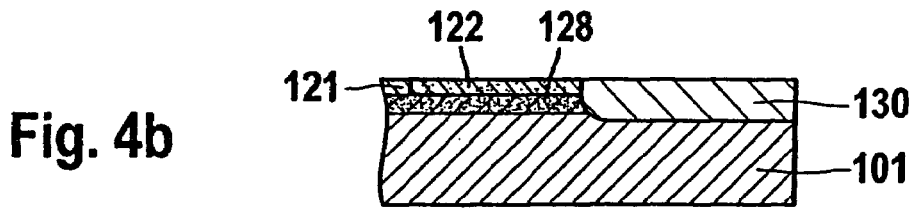
Figure 4C:
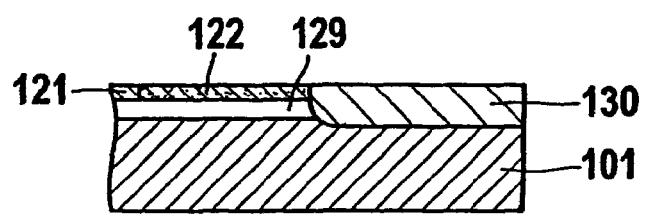
Figure 4D:
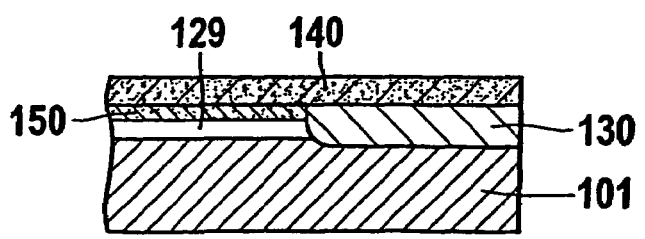

Following the etching process, in the region where no covering 110 is provided, superficial layer 120 shown in FIG. 4a, which is comparatively highly doped, has a pore structure, which is mesoporous and is oriented perpendicularly to the surface. This comparatively highly doped layer 120 has an electrical resistance of approximately 0.1 Ωcm and a thickness of approximately 1 µm. These perpendicularly disposed, mesoporous pores close up relatively quickly in response to the rearrangement of the silicon material according to the present invention. Since the forming of porous silicon is an isotropic etching process, cover 110, which is used as a mask and is made, for example, of silicon nitride, is laterally undercut. In this way, the pores are formed which run in second section 121 substantially in parallel to the surface of the covering layer. Thus, the pore structure in second section 121 of covering layer 150 may be referred to as a lateral structure. These lateral pores close up much later during the temperature treatment and may thus be used as gas-exchange openings in accordance with the present invention or as venting holes in accordance with the present invention.

FIGS. 5 and 6 show two different exemplary embodiments for producing the lateral pore structure of the present invention or the venting holes of the present invention.

Figure 5A:
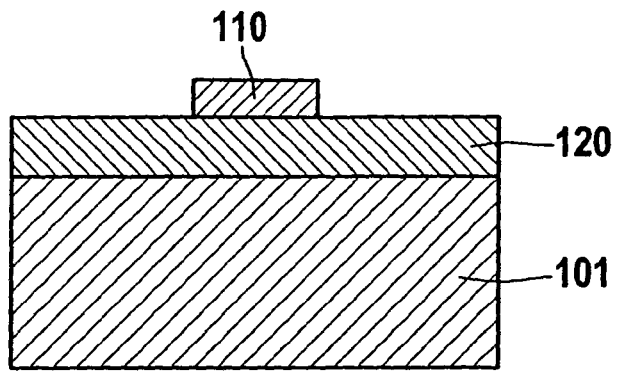
FIG. 5 shows a first embodiment for producing venting holes in accordance with the present invention.
Figure 5B:
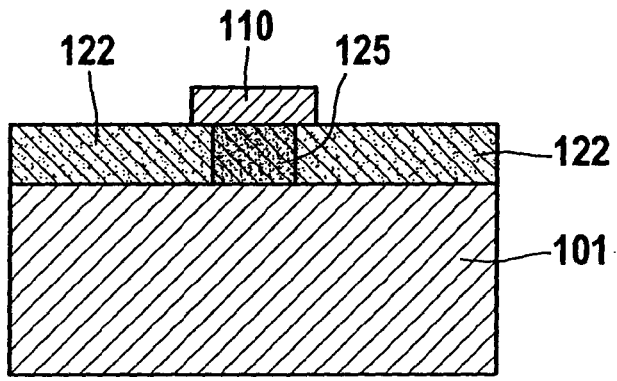

On silicon substrate 101 in FIG. 5, relatively heavy, positive surface doping is again provided, resulting in the formation of layer 120 on silicon substrate 101. In the first section of this layer 120, no cover 110 is provided and, in a second section of this layer, a cover 110 is provided. These are the conditions shown in FIG. 5a, prior to the etching process. FIG. 5b illustrates the conditions prevailing following the first step of the etching process. Here, in first section 122 of the superficially doped layer 120, porous silicon is formed. It exhibits a pore structure having perpendicularly running pores. In the second section, i.e., underneath cover 110, a region denoted by 125 is formed which has a lateral pore structure. This region has a pore structure formed in mesoporous silicon. The size of cover 110 is in accordance with the undercut-type etching. For example, the undercut-etching of region 110 is about 15 µm, and the size of cover 110 in the direction of this undercut-type etching is selected to be about 10–20 µm. The undercut-type etching is made visible in FIG. 5b in that second section 125 is narrower than cover 110.

Figure 6A:
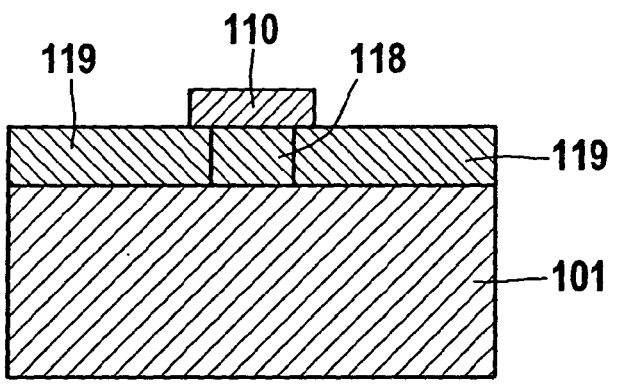
FIG. 6 shows a second embodiment for producing venting holes in accordance with the present invention.
Figure 6B:
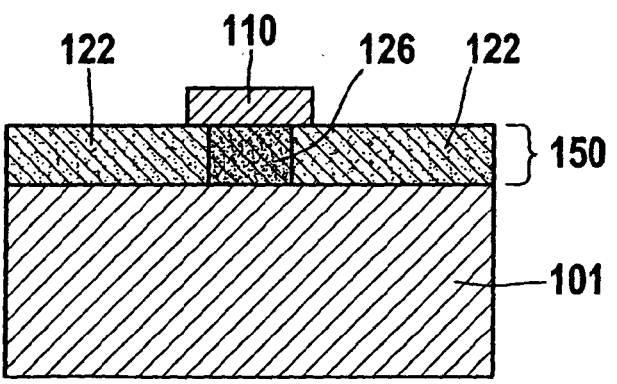
Figure 7:
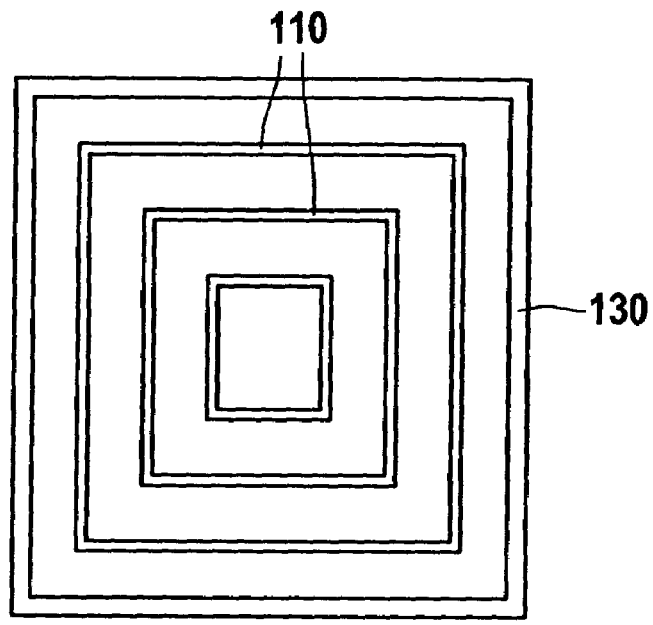
FIG. 7 shows a first variant of the arrangement of the venting holes in accordance with the present invention.
Figure 8:
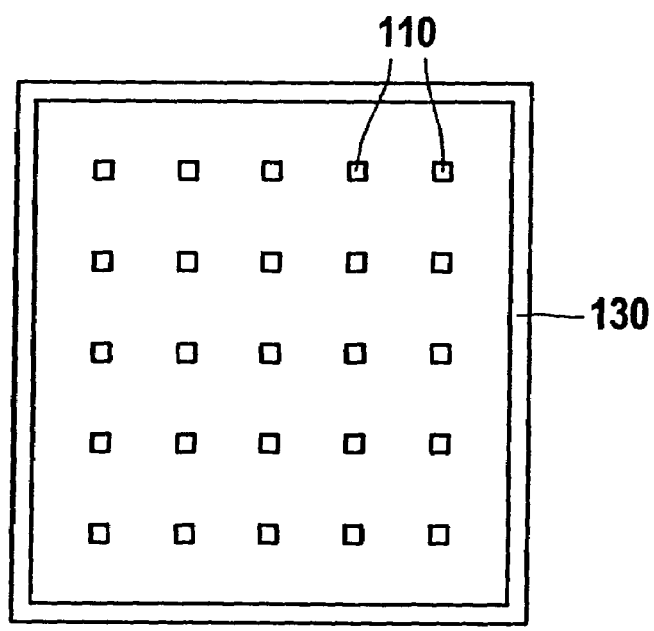
FIG. 8 shows a second variant of the arrangement of the venting holes in accordance with the present invention.

In FIG. 6, a second exemplary embodiment for implementing the venting holes of the present invention is shown where the superficially doped layer 120, however, has a more heavily doped region 119 (dopant concentration $>5 \cdot 10^{16}$ 1/cm$^3$) and a less heavily doped region 118 (substrate doping, approx. $5 \cdot 10^{15}$ 1/cm$^3$). The less heavily doped region 118 is situated underneath cover 110 or cover region 110. It is provided, in particular, in accordance with the present invention that the doping of less heavily doped region 118 corresponds to the doping of substrate 101, and that the heavier doping is introduced merely in structurized form to produce more heavily doped regions 119. The situation is shown, again, in FIG. 6a prior to the etching process. FIG. 6b depicts the situation following the first step of the first etching procedure. This means substantially perpendicularly running pores are situated in uncovered region 122 of covering layer 150, and a region 126, which is essentially a pore structure having lateral pores, is formed in second section of covering layer 150, which substantially corresponds to the less heavily doped region 118 prior to the etching procedure. Here, however, in region 126, i.e., in the second section of covering layer 150, no mesoporous silicon having low porosity is formed due to the lower doping in this region, but rather nanoporous silicon having a higher porosity, which, at this point, likewise closes up later than the remaining diaphragm region, i.e., the remaining region of covering layer 150, when an annealing step is carried out to dissolve the silicon oxide. The size of cover 110 is again in accordance with the magnitude of the undercutting-type etching. For example, the extent of cover region 110, given an undercut-type etching of approximately 6 µm, is on the order of magnitude of 5–10 µm. One alternative exemplary embodiment of the present invention may provide that the overlapping of cover region 110, shown in FIG. 6, over the less heavily doped section 118, be approximately equal in size to the thickness or depth of the more heavily doped section 119. In this case, the width of the cover region is clearly greater than twice the extent of the overlapping. In this situation, the etching boundaries of lower porosity do not touch underneath cover 110 during the first etching step. During the second etching step, section 118 situated underneath cover 110 is then etched to a highly porous state, with the result that these regions then assume the function of venting holes during the annealing process. In another exemplary embodiment, the need may be eliminated for cover 110 in the case of FIG. 6. Here, only perpendicular pore structures are then formed in sections 118 and 119. As a result of the different dopings of regions 118 and 119, nanoporous silicon having a higher porosity is formed in region 118 and, in the subsequent annealing steps, closes up later than surrounding mesoporous regions 119. Thus, in this case as well, the dissolving of native oxide is favored. The order of magnitude of the venting holes is in accordance with the thickness of the epitaxial layer, since this layer must reliably seal the holes. For that reason, the hole diameter must be smaller than the epitaxial thickness. A first variant for distributing or for arranging cover regions 110 on later covering layer 150 is shown in FIG. 7. A plan view of the part of semiconductor component relevant to the present invention is shown in FIGS. 7 and 8. Region 130, which is already described in the context of FIG. 4 and, for example, is negatively doped and, for that reason, is not attacked by the porosifying etching process, forms the frame within which covering layer 150 and cavity 129 are provided. However, covering layer 150 and cavity 129 are not explicitly indicated in FIGS. 7 and 8. The distribution of cover 110 is provided in FIG. 7 within the diaphragm region, i.e., in the region surrounded by region 130 of the substrate, in the form of square or quadratic lines, so that sufficient spacing from the edge of the diaphragm region or from the edge of the cavity is ensured. The general position of the venting holes and, thus, of cover 110 should not lie in the area of the measuring elements (not shown in FIGS. 7 and 8), which are situated on or in diaphragm layer 140. The measuring systems or measuring elements in diaphragm layer 140 are provided, in particular, as piezoresistors and may be situated at the transition region at the edge of cavity 129. Since the epitaxial quality in the area of venting holes or cover 110 is not very good or is poorer than in the remaining diaphragm region, the zones of cover 110 or also covering zones 110 should not come to rest in the area of the edge of cavity 129. The spacing of covering zones 110 to the edge of cavity 129 should be dimensioned such that, in the available time period, while the material is being purified of silicon oxide, the $H_2$ atmosphere has access to all areas which still have silicon oxide to be removed. When all the silicon oxide is removed, a complete rearrangement may come about to form the cavity and the covering layer.

In FIG. 8, covering regions 110 are provided as points or as small squares. Both in FIG. 7, as well as in FIG. 8, the relevant dimensions of covered regions 110, and/or in FIG. 7, the width of covered regions 110, are provided in the manner previously described in connection with the dimensions of cover 110.

The arrangement of venting holes 110, also designated as venting holes, venting lines, or venting areas, on the diaphragm optimally conforms to the strain distribution in the diaphragm, so that no stress maxima occur at the individual venting holes. In the same way, it may be advantageous in FIG. 7 if the lines do not have any corners, but rather are rounded, i.e., are isolines of the same strain in the diaphragm.

What is claimed is:

1. A semiconductor component, comprising:
   a semiconductor substrate;
   a covering layer, above a hollow space, made from porous silicon material, wherein the covering layer includes a first section and a second section, a first earlier pore structure of the first section differing from a second earlier pore structure of the second section.

2. The semiconductor component of claim 1, wherein the semiconductor component includes a pressure sensor.

3. The semiconductor component of claim 1, wherein the first earlier pore structure in the first section is oriented substantially perpendicularly to a main substrate plane, and the second earlier pore structure in the second section is oriented substantially in parallel to the main substrate plane.

4. The semiconductor component of claim 1, wherein one of the second earlier pore structure in the second section is provided as a mesoporous structure, the second earlier pore structure in the second section is provided as a nanoporous structure, and the pore structure in the second section has a higher porosity than in the first section.

5. The semiconductor component of claim 1, wherein the semiconductor substrate includes silicon.

6. The semiconductor component of claim 1, further comprising: a diaphragm layer above the covering layer.

* * * * *